United States Patent
Dong et al.

(10) Patent No.: US 9,130,110 B2
(45) Date of Patent: Sep. 8, 2015

(54) METHOD OF STRIPPING HOT MELT ETCH RESISTS FROM SEMICONDUCTORS

(75) Inventors: Hua Dong, Shrewsbury, MA (US); Robert K. Barr, Shrewsbury, MA (US)

(73) Assignee: Rohm and Haas Electronic Materials LLC

( * ) Notice: Subject to any disclaimer, the term of this patent is extended or adjusted under 35 U.S.C. 154(b) by 67 days.

(21) Appl. No.: 13/239,358

(22) Filed: Sep. 21, 2011

(65) Prior Publication Data

US 2012/0070992 A1 Mar. 22, 2012

Related U.S. Application Data

(60) Provisional application No. 61/385,071, filed on Sep. 21, 2010.

(51) Int. Cl.

| | |
|---|---|
| *C03C 15/00* | (2006.01) |
| *C09K 13/00* | (2006.01) |
| *H01L 31/18* | (2006.01) |
| *G03F 7/42* | (2006.01) |
| *H01L 31/0224* | (2006.01) |

(52) U.S. Cl.
CPC ............. *H01L 31/18* (2013.01); *G03F 7/425* (2013.01); *H01L 31/022425* (2013.01); *H01L 31/1804* (2013.01); *Y02E 10/547* (2013.01)

(58) Field of Classification Search
CPC ........ C11D 11/0035; C11D 7/12; C11D 7/14; H05K 2203/0793; G03F 7/425; H01L 31/022425; H01L 31/18; Y02E 10/50; Y02E 10/52; Y02E 10/547; C09D 11/34
USPC ................ 216/37, 39, 41, 42, 49, 57, 58, 83; 252/79.1, 79.4, 79.5; 438/689, 694, 438/741, 758, 759
See application file for complete search history.

(56) References Cited

U.S. PATENT DOCUMENTS

| | | | |
|---|---|---|---|
| 4,297,391 A | 10/1981 | Lindmayer | |
| 4,623,751 A | 11/1986 | Kishi et al. | |
| 4,816,549 A | 3/1989 | Rumack | |
| 4,857,143 A * | 8/1989 | Glenning et al. | 216/83 |
| 4,904,571 A | 2/1990 | Miyashita et al. | |
| 4,980,301 A | 12/1990 | Harrus et al. | |
| 5,320,684 A | 6/1994 | Amick et al. | |
| 5,391,234 A * | 2/1995 | Murphy | 134/38 |
| 5,431,847 A * | 7/1995 | Winston et al. | 510/175 |
| RE35,045 E * | 10/1995 | Winston et al. | 134/40 |
| 5,645,632 A | 7/1997 | Pavlin | |
| 5,772,789 A * | 6/1998 | Eichhorn et al. | 134/40 |
| 5,783,657 A | 7/1998 | Pavlin et al. | |
| 5,981,680 A | 11/1999 | Petroff et al. | |
| 5,998,570 A | 12/1999 | Pavlin et al. | |
| 6,268,466 B1 | 7/2001 | MacQueen et al. | |
| 6,399,713 B1 | 6/2002 | MacQueen et al. | |
| 6,492,458 B1 | 12/2002 | Pavlin | |
| 6,552,160 B2 | 4/2003 | Pavlin | |
| 6,864,349 B2 | 3/2005 | Pavlin et al. | |
| 6,870,011 B2 | 3/2005 | MacQueen et al. | |
| 6,956,099 B2 | 10/2005 | Pavlin | |
| 7,622,613 B2 * | 11/2009 | Kamata et al. | 568/67 |
| 7,677,942 B2 * | 3/2010 | Shin et al. | 445/24 |
| 7,718,092 B2 | 5/2010 | Rose et al. | |
| 7,771,623 B2 | 8/2010 | Young et al. | |
| 7,888,168 B2 * | 2/2011 | Weidman et al. | 438/98 |
| 7,951,764 B2 | 5/2011 | Inaoka | |
| 8,303,832 B2 * | 11/2012 | Torres et al. | 216/49 |
| 2003/0136763 A1 * | 7/2003 | Nakagawa et al. | 216/83 |
| 2004/0131779 A1 | 7/2004 | Haubrich et al. | |
| 2004/0186263 A1 | 9/2004 | Pavlin | |
| 2005/0282093 A1 | 12/2005 | Dammel et al. | |
| 2008/0044763 A1 * | 2/2008 | Fujimaki | 430/273.1 |
| 2009/0008787 A1 * | 1/2009 | Wenham et al. | 257/773 |
| 2009/0127588 A1 | 5/2009 | Sirringhaus | |
| 2009/0263928 A1 * | 10/2009 | Tseng | 438/73 |
| 2009/0308435 A1 * | 12/2009 | Caiger | 136/252 |
| 2010/0029077 A1 | 2/2010 | Barr et al. | |
| 2010/0129754 A1 | 5/2010 | Cheetham et al. | |
| 2010/0218826 A1 | 9/2010 | Hahn et al. | |

FOREIGN PATENT DOCUMENTS

| | | |
|---|---|---|
| EP | 0375255 A2 | 12/1989 |
| JP | 05148465 A | 6/1993 |
| WO | WO 2005/011979 A2 | 2/2005 |
| WO | WO 2005/013323 A2 | 2/2005 |
| WO | WO 2006/011747 A1 | 2/2006 |

OTHER PUBLICATIONS

Gauthier et al., ("Industrial Approaches of Selective Emitter on Multicrystalline Silicon Solar Cells", 24th European Photovoltaic Solar Energy Conference, Sep. 21-25, 2009, Hamburg, Germany), whole doc.*
B. D. McNicol et al.; "Pt/Sn bimetallic catalysts for the electrooxidation of methanol: poisoning by silicate and phosphate unions"; Journal of Applied Electrochemistry , vol. 6, No. 3, May 1, 1976; pp. 221-227.
European Search Report of corresponding European Application No. 11 18 2052.
Hungarian Search Report of corresponding Singapore Application No. 201106795-6.
Chinese Search Report of corresponding Chinese Application No. 201110402956.0; Date of Dispatch Jan. 6, 2014.
Hawley's Condensed Chemical Dictionary; 14th Edition; Copyright 2001 by John Wiley & Sons, Inc. New York; p. 1174.

* cited by examiner

*Primary Examiner* — Nadine Norton
*Assistant Examiner* — Christopher Remavege

(57) ABSTRACT

Hot melt etch resist is selectively applied to an anti-reflective coating or a selective emitter on a semiconductor wafer. The exposed portions of the anti-reflective coating or selective emitter are etched away using an inorganic acid containing etch to expose the semiconductor surface. The hot melt etch resist is then stripped from the semiconductor with an alkaline stripper which does not compromise the electrical integrity of the semiconductor. The exposed semiconductor is then metalized to form current tracks.

12 Claims, No Drawings

METHOD OF STRIPPING HOT MELT ETCH RESISTS FROM SEMICONDUCTORS

This application claims the benefit of priority under 35 U.S.C. §119(e) to U.S. Provisional Application No. 61/385,071, filed Sep. 21, 2010, the entire contents of which application are incorporated herein by reference.

The present invention is directed to an improved method of stripping hot melt etch resists from semiconductors with an alkaline stripper. More specifically, the present invention is directed to an improved method of stripping hot melt etch resists from semiconductors with an alkaline stripper which does not compromise the electrical integrity of the semiconductor.

The manufacture of semiconductor devices, such as photovoltaics and solar cells, involves the formation of electrically conductive contacts or current tracks on front and back sides of semiconductors. The metal current tracks must be able to establish ohmic contact with the semiconductor in order to ensure that charge carriers emerge from the semiconductor into the electrically conductive contacts without interference. In order to avoid current loss, metallized contact grids must have adequate current conductivities, i.e. a high conductivity or a sufficiently high conductor track cross section.

Numerous processes exist for metal coating the back side of solar cells. Usually aluminum is the choice of metal for the back side. The aluminum is applied, for example, by vapor deposition or by being printed onto the back side and being driven in or alloyed in. Metal coatings using thick-film techniques are conventional methods for metallizing conductor tracks. Pastes used include metal particles and are electrically conductive as a result. The pastes are applied by screen, mask, pad printing or paste writing. A commonly used process is the screen printing process where finger-shaped metal coating lines having a minimum line width of 80 μm to 100 μm are made. Even at this grid width electrical conductivity losses are evident in comparison with a pure metal structure. This can have an adverse effect on the series resistance and on the fill factor and efficiency of the solar cell. This effect is intensified at smaller printed-on conductor track widths because the process causes the conductor tracks to become flatter. Nonconductive oxide and glass components between the metal particles constitute a fundamental cause of this reduced conductivity.

When metal coating the front sides, or light incidence sides, the objective is to use as much of the surface as possible for capturing photons. Complex processes for producing the front side contacts make use of laser and other imaging techniques for the definition of the conductor track structures. The front side of the semiconductor may be subjected to crystal-oriented texture etching in order to impart to the surface an improved light incidence geometry which reduces reflections. To produce the semiconductor junction, phosphorus diffusion or ion implantation takes place on the front side of the semiconductor to produce an n-doped (n+ or n++) region and provides the semiconductor with a PN junction. The n-doped region may be referred to as the emitter layer.

An anti-reflective coating is added to the front side or emitter layer. In addition the anti-reflective coating may serve as a passivation layer. Suitable anti-reflective coatings include silicon oxide layers such as $SiO_x$ silicon nitride layers such as $Si_3N_4$, or a combination of silicon oxide and silicon nitride layers. In the foregoing formulae, x is the number of oxygen atoms, typically x is the integer 2. Such anti-reflective coatings may be deposited by a number of techniques, such as by various vapor deposition methods, for example, chemical vapor deposition and physical vapor deposition.

An opening or pattern is then defined on the front side. The pattern reaches through the anti-reflective coating to expose the surface of the semiconductor. A variety of processes may be used to form the pattern, such as, but not limited to, laser ablation, mechanical means, chemical and masking processes. Typical chemical and masking processes include selectively applying chemical or etch resistant masking material on the front of the semiconductor, followed by applying the etch material to form openings in the anti-reflective layer. An example of a chemical or etch method of forming an opening on the front side is etching with a buffered oxide etch. Buffered oxide etches may include one or more inorganic acids in combination with a buffering agent, such as an ammonium compound. After etching the mask is usually removed prior to metallization of the current tracks. In general alkaline solutions which include sodium or potassium hydroxide are used to remove or strip the mask from the semiconductor. Stripping is typically done by immersing the entire semiconductor with the mask in the alkaline solution or by spraying the semiconductor with the alkaline solution. In either case the alkaline stripping solution contacts both the exposed semiconductor where metallization is done and the back side aluminum electrode compromising the electrical integrity of the semiconductor. In order to achieve metallization of the current tracks, both the front of the semiconductor and the aluminum electrodes must be sufficiently conductive. However, alkaline strippers, such as sodium hydroxide and potassium hydroxide, increase the sheet resistivity of the semiconductor and also cause corrosion of the aluminum electrodes such that the conductivity of the semiconductor is reduced. This in turn compromises metallization of the front side of the semiconductor resulting in reduced ohmic contact between the current tracks and the semiconductor as well as current loss. Accordingly, there is a need for a stripper formulation which inhibits increase of sheet resistance and corrosion of aluminum electrodes.

Methods include: a) providing a semiconductor substrate including a PN junction, an anti-reflective coating on a front side and an electrode comprising aluminum on a back side of the semiconductor substrate with the PN junction; b) selectively applying a hot melt etch resist to the anti-reflective coating on the semiconductor substrate with the PN junction; c) applying an etchant to exposed portions of the anti-reflective coating of the semiconductor substrate with the PN junction to remove the exposed portions of the anti-reflective coating and selectively exposing the front side of the semiconductor substrate with the PN junction; and d) applying a stripper which includes potassium carbonate and potassium silicate to the semiconductor substrate with the PN junction to remove the hot melt etch resist from the anti-reflective coating.

Methods also include: a) providing a semiconductor substrate including a PN junction, a selective emitter on a front side and an electrode comprising aluminum on a back side of the semiconductor substrate with the PN junction; b) selectively applying a hot melt etch resist to the selective emitter on the semiconductor substrate with the PN junction; c) applying an etchant to exposed portions of the selective emitter with the PN junction to etch the exposed portions; and d) applying a stripper which includes potassium carbonate and potassium silicate to the semiconductor substrate with the PN junction to remove the hot melt etch resist from the selective emitter.

The stripper compositions which include potassium carbonate and potassium silicate used in the methods readily remove the hot melt etch resists from the anti-reflective coatings or selective emitter layers of the doped semiconductor substrates and at the same time do not compromise the electrical integrity of the semiconductor substrate with the PN junction. The sheet resistance of the front of the semiconductor substrate with the PN junction remains substantially unaffected by the stripper such that metal may be readily deposited on the exposed portions of the front of the semiconductor substrate to form current tracks. In addition, the strippers do not cause corrosion of the aluminum containing electrodes on the back side of the semiconductor substrate. Accordingly, sufficient ohmic contact is achieved to ensure that charge carriers emerge from the semiconductor into the electrically conductive current tracks without interference to provide the desired electrical conductivity.

As used throughout this specification, the terms "depositing" and "plating" are used interchangeably. The terms "current tracks" and "current lines" are used interchangeably. The terms "composition" and "bath" are used interchangeably. The indefinite articles "a" and "an" are intended to include both the singular and the plural. The term "selectively depositing" means that deposition of a material occurs in specific desired areas on a substrate. The term "etch resist" means a composition which is not physically or chemically altered by etchants containing inorganic or organic acids. The term "hydrogenated" means a chemical compound where part or all of its unsaturated chemical bonds (—C═C—) have been chemically treated to break or saturate the bonds with hydrogen (—CH$_2$—CH$_2$—).

The following abbreviations have the following meanings unless the context clearly indicates otherwise: ° C.=degrees Celsius; g=grams; mg=milligrams; cps=centipoise, 1 cps=1× 10$^{-3}$ pascals (Pas)=0.01 poise=1.02×10$^{-4}$ kps/m$^2$; A=amperes; dm=decimeter; μm=micrometers; nm=nanometers; and UV=ultra violet.

All percentages and ratios are by weight unless otherwise indicated. All ranges are inclusive and combinable in any order except where it is clear that such numerical ranges are constrained to add up to 100%.

Stripper compositions include the combination of potassium carbonate and potassium silicate in an aqueous solution. The stripper is used to remove substantially all of the hot melt resist on a semiconductor substrate having a PN junction used in the manufacture of photovoltaics and solar cells. The potassium carbonate and the potassium silicate do not substantially increase the sheet resistance of the semiconductor or cause corrosion of aluminum containing electrodes on the back side of the semiconductor substrate to compromise its conductivity. Accordingly, current tracks deposited on the front side of the semiconductor have sufficient ohmic contact with the semiconductor surface or emitter layer to ensure that charge carriers emerge from the semiconductor into the electrically conductive current tracks without interference to provide the desired electrical conductivity. The stripping compositions are prepared as concentrates then diluted to desired concentrations prior to application. The specific dilution may vary depending on the composition of the hot melt etch resist. Sodium salts of carbonate and silicate are excluded from the stripper compositions. In addition, any compound which may compromise the electrical integrity of the semiconductor substrate is also excluded from the stripper compositions. Optionally, one or more antifoaming agents may be included in the stripper compositions; however, the choice of antifoam may not substantially compromise the electrical integrity of the semiconductor substrate.

The stripper composition is used in the manufacture of photovoltaics and solar cells which may be composed of monocrystalline, polycrystalline or amorphous silicon semiconductor wafers. While the description below is with regard to silicon semiconductor wafers, other suitable semiconductor substrates, such as gallium-arsenide, silicon-germanium, and germanium wafers, may also be used. When silicon wafers are used, they typically have a p-type base doping.

The entire back side of the semiconductor substrate may be aluminum coated or a portion of the back side may be aluminum coated, such as to form a grid. Such back side metallization may be provided by a variety of techniques known in the art. Typically, an aluminum coating is applied to the back side in the form of an electrically conductive aluminum paste or may be aluminum-containing paste which may also include other metals such as silver, nickel, palladium, copper, zinc or tin. Such conductive pastes typically include conductive particles of the metal embedded in a glass matrix and an organic binder. The conductive pastes may be applied to the substrate by a variety of techniques, such as screen printing. After the paste is applied, it is fired to remove the organic binder. Firing is typically done at temperatures of 600° C. to 800° C. When a conductive paste containing aluminum is used, the aluminum partially diffuses into the back side of the substrate, or if used in paste form containing silver or another metal, may alloy with the silver or the other metal. Use of such aluminum-containing paste may improve the resistive contact and provide a "p+"-doped region. Heavily doped "p+"-type regions ("p++"-type regions) by previous application of aluminum or boron with subsequent interdiffusion may also be produced. Typically, heavily doped "p+"-type regions are made.

The front side of the substrate may be subjected to crystal-oriented texture etching in order to impart to the surface an improved light incidence geometry which reduces reflections. To produce the semiconductor junction, phosphorus diffusion or ion implantation takes place on the front side of the wafer to produce an n-doped (n+ or n++) region and provides the wafer with a PN junction. The n-doped region may be referred to as the emitter layer.

An anti-reflective coating is added to the front side or emitter layer of the wafer. In addition the anti-reflective coating may serve as a passivation layer. Suitable anti-reflective coatings include, without limitation, silicon oxide coatings such as SiO$_x$, silicon nitride coatings such as Si$_3$N$_4$, or a combination of silicon oxide and silicon nitride coatings. In the foregoing formulae, x is the number of oxygen atoms, typically x is the integer 2, i.e., silicon dioxide. Such anti-reflective coatings may be deposited by a number of techniques, such as by various vapor deposition methods, for example, chemical vapor deposition and physical vapor deposition. While there is no thickness limitation on the silicon oxide and silicon nitride coatings, typically, they are 50 nm to 150 nm thick.

Hot melt etch resists may be selectively deposited on the anti-reflective coating by inkjet printing, aerosol or screen printing. The hot melt etch resists are selectively applied to form an image which is negative to the current tracks. WO 2005/013323 and WO 2005/011979 disclose methods of screen printing resists in the manufacture of photovoltaic devices. Preferably, the hot melt etch resists are selectively applied to anti-reflective coatings using inkjet printing or aerosol. More preferably, they are selectively applied using inkjet printing. Viscosities of the hot melt etch resist during application by inkjet printing or aerosol range from 7 cps to 21 cps, preferably from 9 cps to 15 cps. Most preferably the hot melts are applied at viscosities of 10 cps to 12 cps.

The inkjet printing method may be a continuous inkjet method or a drop-on-demand method. The continuous method is a printing method where the direction of the etch resist is adjusted by changing an electromagnetic field while continuously jetting the etch resist using a pump. The drop-on-demand is a method which dispenses the etch resist only when needed on an electronic signal. Drop-on-demand may be divided into a piezoelectric ink jet method where pressure is generated by using a piezoelectric plate causing a mechanical change by electricity and a thermal ink jet method using pressures which are generated by the expansion of bubbles produced by heat.

In contrast to the inkjet printing method, the aerosol method first forms an aerosol of the etch resist. The aerosol is guided to the semiconductor substrate via a pressurized nozzle with the pressurized nozzle being mounted to a print head. The aerosol is mixed with a focusing gas and is transported to the pressurized nozzle in a focused form. The use of focusing gas to dispense the etch resist reduces the probability of clogging the nozzles and also enables the formation of finer current tracks, a greater aspect ratio than with an inkjet apparatus.

The hot melt etch resists are selectively applied to the surface of the anti-reflective coating at temperatures of 95° C. and less, preferably 65° C. to 90° C. More preferably, the hot melt etch resists are applied at temperatures of 70° C. to 80° C. Such low inkjet temperatures allow the resists to be used in most inkjet printhead modules. Also, the etch resist has longer shelf life under low temperatures. The hot melt etch resists rapidly harden after application and adhere to the surface of the anti-reflective coating such that no hardening agents or cross-linking agents are required in the formulation. Accordingly, UV application steps and other conventional hardening steps or curing are eliminated from the method. The hot melt etch resists are uncured resists. Although there is no limitation on the thickness of current lines made with the methods, typically, the hot melt etch resists are selectively applied to a coating of $SiO_x$ or silicon nitride to form current lines having widths of 100 μm or less, or such as from 80 μm to 20 μm, or such as from 70 μm to 30 μm.

In an alternative embodiment, the hot melt etch resists are selectively applied to a surface of a selective emitter not onto an anti-reflective coating. Selective emitter layers of semiconductors include zones of high surface doping concentrations, for example, more than $5 \times 10^{19}$ cm$^{-3}$, which results in a sheet resistivity of, for example, less than 60 ohms per square, typically, less than 50 ohms per square and more typically less than 40 ohms per square. The adjacent zones of low surface doping concentrations are, for example, less than $1 \times 10^{19}$ cm$^{-3}$, which results in a sheet resistance of, for example, more than 60 ohms per square, typically more than 70 ohms per square, and more typically more than 80 ohms per square. Typically the hot melt etch resists are selectively applied to cover the zones of high doping concentrations or the zones of low sheet resistance. The anti-reflective layer is not deposited onto the selective emitter layer until after the etching and removal of the hot melt resist. Typically, the anti-reflective layer of silicon nitride or silicon dioxide is deposited over the entire selective emitter and current tracks are selectively formed over the zones of high doping or low sheet resistance. The current tracks make ohmic contact with the underlying zones of low sheet resistance by means of spikes. U.S. patent publication 2010/0218826 discloses such selective emitters and their manufacture in solar cells.

The hot melt etch resists include components which are resistant to inorganic acid etches as well as buffered oxide etches. Such materials include, but are not limited to, waxes, such as, natural waxes, chemically modified waxes, and synthetic waxes, and polyamide resins. Natural waxes include, but are not limited to, carnauba wax, montan wax, vegetable waxes, fatty acid waxes. Synthetic waxes include, but are not limited to, paraffin waxes, microcrystalline polyethylene waxes, polypropylene waxes, polybutylene waxes, polyethylene acrylic waxes, polyester waxes, and Fischer-Tropsch wax. Chemically modified waxes include derivatives of waxes. Typically the waxes used are fatty acid waxes and paraffin waxes and derivatives thereof. More typically paraffin waxes are used. Examples of polyamide resins which may be used in the hot melt resist are disclosed in U.S. Pat. Nos. 5,645,632; 5,783,657; 5,998,570; 6,268,466; 6,399,713; 6,492,458; 6,552,160; 5,981,680; 4,816,549; 6,870,011; 6,864,349; and 6,956,099; as well as U.S. Published Patent Application 20040186263, which are hereby incorporated, in their entirety, herein by reference. Examples of commercially available polyamide resins are Sylvaclear® 2612, Sylvagel® 5600, Sylvagel® 6100, Sylvaclear® 100, Sylvaclear® 100LM, Sylvaclear® C75v, Uniclear® 100 and Uniclear®100v. All are obtainable from Arizona Chemical Company, Jacksonville, Fla., U.S.A. Waxes are included in hot melt etch resists in various amounts which are well known in the art and literature. For example, typically fatty acid waxes are included in amounts to provide an acid number of 50 to 400 or such as from 150 to 300 (mg KOH/g).

The hot melt etch resists may include one or more hydrogenated rosin resins which include as a main component hydrogenated or partially hydrogenated rosin acids or salts thereof which are derived from rosin acids of the abietic and pimaric types with a general formula $C_{19}H_{29}COOH$ with a phenanthrene nucleus. Isomers include, but are not limited to, levopimaric acid, neoabietic acid, palustric acid, dehydroabietic acid, dihydroabietic acid (3 probable) and tetrahydroabietic acid. The average weight molecular weight ranges from 300 to 308, or such as from 302 to 306. The acid number is at least 150, or such as from 155 to 200, or such as from 170 to 190 (mg KOH/g). Rosin is derived from pine trees (chiefly *Pinus palustris* and *Pinus elliotii*). Gum rosin is the residue obtained after distillation of turpentine oil form the oleoresin tapped from living trees. Wood rosin is obtained by extracting pine stumps with naphtha and distilling off the volatile fraction. Tall oil is co-product of the fractionation of tall oil. Hydrogenated rosin resins may be obtained commercially or extracted from their natural sources and refined according to methods disclosed in the literature. An example of a commercially available partially hydrogenated rosin resin is STAY-BELITE® A hydrogenated rosin available from Pinova Incorporated. Another commercially available partially hydrogenated rosin resin is STAYBELITE® Resin-E. A commercially available fully hydrogenated rosin is FORAL™ AX-E. In general, hydrogenated rosin resins may be included in the hot melt etch resists in amount of greater than or equal to 20 wt %, or such as from 20 wt % to 30 wt %, or such as from 25 wt % to 28 wt %.

When the hot melt etch resists include one or more hydrogenated rosin resins, they typically include one or more fatty acids or salts thereof having a formula $R^1COO-M$ where $R^1$ is a linear, branched or cyclic alkyl or alkenyl group having 7 to 48 carbon atoms, preferably 12 to 24 carbon atoms and M is hydrogen or a counterion such as sodium, potassium, calcium ammonium or $NH_y(CH_2CH_2OH)_z$ where y and z are integers from 0 to 4 and their sum is always 4. Such fatty acids include, but are not limited to, caprylic acid, capric acid, lauric acid, linoleic acid, myristic acid, oleic acid, palmitic acid and stearic acid or salts thereof. Typically, the fatty acids are chosen from lauric acid, linoleic acid, myristic acid, palmitic acid, stearic acid and salts thereof. Preferably the fatty acids are chosen from myristic acid, palmitic acid and salts thereof. Such fatty acids and salts thereof have acid numbers of 200 and greater, typically, from 215 to 250 (mg KOH/g). Many of the fatty acids or salts thereof may be derived from natural oils, such as marine, rapseed, tallow, tall oil, soy, cottonseed and coconut. Such fatty acids, salts and mixtures are either commercially available or may be manufactured by techniques known in the art. In general, such fatty acids and salts thereof may be included in the hot melt etch resists in amounts of at least 65 wt %, or such as from 70 wt % to 80 wt %, or such as from 75 wt % to 82 wt %.

Optionally, the hot melt etch resists include one or more optical brighteners. Conventional optical brighteners, such as fluorescent whitening agents, may be used. Such optical brighteners include, but are not limited to, 4,4'-bis[2-(2-methoxyphenyl)ethenyl]-1,1'-biphenyl; 1,4-bis(2-cyano styryl) benzene; 2,2'-(1,4-naphthalenediyl)bisbenzoxazole; 2,2'-(2, 5-thiophenediyl)bis[5-(1,1-dimethylethyl)]-benzoxazole; 2,5-thiophenediylbis(5-tert-butyl-1,3-benzoxazole); and 2,2'-(1,2-ethenediyldi-4,1-phenylene)bisbenzoxazole. Examples of commercially available fluorescent white agents are UVITEX™ FP and UVITEX™ OB by Ciba Switzerland and BLANKOPHOR™ ER by Bayer A.G., Germany. Such optical brighteners may be included in the hot melt etch resists in amounts of 0.01 wt % to 1 wt % or such as from 0.05 wt % to 0.1 wt %.

The etchant may be applied to the semiconductor substrate with the hot melt etch resist selectively coating the $SiO_x$, silicon nitride, or selective emitter by any suitable method known in the art. Such methods include immersion of the semiconductor substrate in an etchant bath, selectively applying by inkjet printing, aerosol or using conventional spray apparatus. The etchant may be applied at mild temperatures. Etch temperatures range from room temperature to 50° C. or such as from 25° C. to 40° C.

The etchant may include one or more inorganic acids and one or more polyols with the balance water. Etching time may vary depending on the components and concentration of the components in the etchant as well as the type of anti-reflective coating. For example, when the anti-reflective coating is silicon nitride the etching is typically from 180 seconds to 300 seconds. When the anti-reflective coating is silicon dioxide, the etching time is typically from 30 seconds to 180 seconds.

Inorganic acids include, but are not limited to, hydrofluoric acid, hydrochloric acid, sulfuric acid, nitric acid and phosphoric acid. Typically the inorganic acids are provided in aqueous form as a concentrated or dilute aqueous solution. Preferably, the inorganic acid is hydrofluoric acid. The inorganic acids may be included in amounts of 1 wt % to 20 wt % of the etchant.

The polyols are water soluble at room temperature and are compatible with inorganic acids such that there are no stability problems. Such polyols include, but are not limited to, glycols, such as polyhydric alcohols, such as ethylene glycol, polyethylene glycol, propylene glycol, polypropylene glycol, butylene glycol, polybutylene glycol, dipropylene glycol, tripropylene glycol, and glycerin. Typically, the polyol is chosen from ethylene glycol and propylene glycol. Such polyols may be included in the etchant in amounts of 20% by volume to 80% by volume, or such as from 40% by volume to 70% by volume, or such as from 50% by volume to 60% by volume.

In addition to the inorganic acids and polyols, ammonium compounds may also be included in the etchant. Typically, the etchant includes one or more ammonium compounds. Ammonium compounds include, but are not limited to, ammonium fluoride and ammonium bifluoride. Preferably the ammonium compound is ammonium fluoride. Typically the ammonium compounds are provided as aqueous concentrates or as dilute solutions. Such ammonium compounds may be included in amounts of 10 wt % to 40 wt % of the etchant.

Typically when an ammonium compound is included in the etchant a volume ratio of ammonium compound to inorganic acid varies from 10:1 to 4:1. A typically etchant is aqueous ammonium fluoride and aqueous hydrogen fluoride at a volume to volume ratio of 10:1 to 4:1 with one or more polyols in amounts of 40% to 60% by volume. The balance of the formulation may be water.

When etching is complete, the semiconductor may be rinsed with water to remove any etchant. The hot melt etch resist is then stripped from the semiconductor substrate. The hot melt etch resist is stripped with the potassium carbonate and potassium silicate aqueous alkaline composition. Potassium carbonate is included in the stripping compositions in amounts of 5 g/L to 50 g/L, or such as from 10 g/L to 30 g/L. Potassium silicate is included in the stripping compositions in amounts of from 0.1 g/L to 10 g/L or such as from 0.5 g/L to 5 g/L. The potassium carbonate is the primary stripping component of the composition while the potassium silicate is included primarily to protect the aluminum containing electrodes on the back side of the semiconductor substrate from corrosion. When one or more antifoams are included in the stripper compositions, they are included in amounts of 0.1 g/L to 10 g/L. The balance of the stripper composition is water.

The stripping compositions are used at temperatures from room temperature to 70° C. or such as from 30° C. to 60° C. Typically, the temperatures range from 40° C. to 50° C. Stripping may take from five minutes or less or such as from one minute to 15 seconds. Typically stripping ranges from 15 seconds to 45 seconds. Stripping of the resist is substantially complete. The resist remains in solution even at room temperature. Minor amounts of resist residue which are not detectable may remain on the semiconductor but may be rinsed from the semiconductor substrate with water.

The stripper compositions are initially made as aqueous concentrates. The concentrates include from 150 g/L to 300 g/L of potassium carbonate and from 5 g/L to 50 g/L of potassium silicate. The antifoam agents may be included in the concentrate or they may be added as needed in the diluted working compositions prior to stripping. When they are included in the concentrate, they may range from 1 g/l to 20 g/L. Typically the antifoam agents are added to the diluted stripper composition prior to stripping. The pH range of both the concentrate and the diluted working stripper compositions is from 8 to 12 or such as from 9 to 11. Typically the pH ranges from 9 to 10.

Antifoaming agents include, but are not limited to, vegetable oils, such as soybean oil, long chain fatty alcohols, such as $C_7$-$C_{22}$ fatty alcohols, silicone based antifoams, such as polydimethylsiloxane, silicone glycols, fluorosilicones and ethylene oxide/propylene oxide copolymers. Examples of commercially available antifoams are ANTIFOAM 2750-1 (available from the Dow Chemical Company), ANTIFOAM 1430 (available from Dow Corning) and TEGO® FOAMEX 835 (available from Evonik).

A layer of metal is then deposited on the front side current lines. Typically a silver paste is applied to the current lines and fired. This is typically followed by light induced metal plating which is well known in the art. Metals, include, but are not limited to, silver, copper and nickel. If the source of the metal is an electroless bath, plating is done without application of external current. If the source of the metal is from an electrolytic bath, a rear side potential (rectifier) is applied to the semiconductor wafer substrate. Examples of commercially available electroless nickel baths are DURAPOSIT™ SMT 88 and NIPOSIT™ PM 980 and PM 988. Examples of commercially available electrolytic nickel baths are the NICKEL GLEAM™ series of electrolytic products. Examples of commercially available copper electroplating baths are COPPER GLEAM™ ST 901 and 901. An example of a commercially useful silver plating bath is available as ENLIGHT™ 620 silver plate. All of the above commercially available baths are obtainable from Rohm and Haas Electronic Materials, LLC Marlborough, Mass.

The light may be continuous or pulsed. The semiconductor is immersed in the metal plating bath and light is applied to the semiconductor resulting on metal plating in the current lines. Light sources include, but are not limited to, incandescent lamps, LED lights (light emitting diodes), infrared lamps, fluorescent lamps, mercury lamps, halogen lamps and lasers.

When the semiconductor substrate includes a selective emitter, the anti-reflective coating is deposited over the entire selective emitter layer by, for example, plasma enhanced chemical vapor deposition step. The current tracks are then printed, such as by means of screen printing using silver-particle-containing thick-film paste onto the high doped zones over the anti-reflective coating. The semiconductor substrate is then fired using conventional methods know in the art such that the printed on current tracks penetrate the anti-reflective coating to make ohmic contact with the zones of high doping.

Typical current densities are from 0.1 A/dm$^2$ to 5 A/dm$^2$. The particular current requirement is dependent upon the particular size of the wafer used. The electroplating processes used are conventional. Typically, such metal layers range from 1 µm to 50 µm, more typically, from 5 µm to 25 µm thick.

The following examples are included to illustrate various aspects of the invention but are not intended to limit the scope of the invention.

EXAMPLES 1

A hot melt inkjet resist having the formula disclosed in the table below was prepared.

| COMPONENT | AMOUNT |
|---|---|
| Partially hydrogenated rosin resin[1] | 24.9 wt % |
| Myristic acid | 75 wt % |
| 2,5-thiophenediylbis(5-tert-butyl-1,3-benzoxazole)[2] | 0.1 wt % |

[1]STAYBELITE ® A typical composition and properties: abietic acid <3 wt %, dehydroabietic acid 6-10 wt %, dihydroabietic acid 60-80 wt %, tetrahydroabietic acid 5-15 wt %, other resin acids and neutrals 10-15 wt %, softening point, Ring & Ball, ° C. = 65-69, acid number 158-160.
[2]UVITEX OB ™: optical brightener.

The hot melt was placed in the reservoir of a DirectMask™ DoD 300 Inkjet Printer (obtainable from Schmid GmbH, Freudenstadt, Germany). The temperature in the reservoir was raised to 75° C. to melt the hot melt etch resist. The resist was selectively printed on the silicon dioxide coating of a monocrystalline silicon wafer at room temperature to form an "H" pattern on the wafer. The hot melt etch resist was allowed to cool to room temperature and harden.

The wafer with the hot melt etch resist was immersed in a stripper composition which was composed of 10 g/L potassium carbonate and 1 g/L potassium silicate with the balance water. The temperature of the stripping composition was 40° C. and the pH was 11. The wafer was agitated while it was in the stripper composition. After 60 seconds all of the resist was removed from the wafer. No resist residue was observable on the silicon wafer.

The method was repeated with two additional wafers. One was immersed in the stripper composition at 45° C. and agitated. After 40 seconds all of the resist was removed from the wafer. The second wafer was immersed in the stripper composition at 50° C. and agitated for 20 seconds. After 20 seconds, no resist residue was observed. Although the amount of stripping time varied with temperature, the stripping composition removed all of the resist from the wafer within commercially acceptable time periods without any observable traces of resist residue left on the wafers.

EXAMPLE 2

Three monocrystalline silicon wafers with PN junctions were selectively printed to form an "H" pattern with the hot melt etch resist of Example 1 above. The hot melt etch resist was printed with the apparatus as described in Example 1. The printed resist was then allowed to cool to room temperature and harden.

The sheet resistance of each wafer was determined. The sheet resistivity of the wafers ranged from 60 ohms per square to 65 ohms per square. A 4-point resistivity probe from Jandel Engineering Ltd. was used to measure the sheet resistance. One wafer was immersed in an aqueous solution of 5 g/L potassium hydroxide at pH 13, the second was immersed in an aqueous solution of 10 g/L sodium carbonate at pH 11 and the third wafer was immersed in an aqueous solution of 10 g/L potassium carbonate at pH 11. The temperature of each solution was 50° C. The dwell time for each wafer in their respective solutions was 9 minutes. All of the resist was removed from each wafer.

The wafers were removed from their solutions and rinsed with water. The sheet resistance of the emitter layer of each wafer was then measured. The sheet resistance of the wafer treated with the 5 g/L potassium hydroxide increased from an initial 65 ohms per square to a high of 155 ohms per square. The wafer treated with 10 g/L sodium carbonate increased from 65 ohms per square to 70 ohms per square. The wafer treated with 10 g/L potassium carbonate increased from 60 ohms per square to 65 ohms per square. The sheet resistivity of the wafers treated with the sodium and potassium carbonates showed little change in sheet resistivity in comparison to the wafer treated with potassium hydroxide. However, when the sodium carbonate solution with the solubilized resist cooled to room temperature, the sodium carbonate solution formed a gel. In contrast, when the potassium carbonate solution with the solubilized resist cooled to room temperature the solution remained clear and flowable indicating that the potassium carbonate stripper was stable and kept the resist in solution.

EXAMPLE 3

A deep emitter (deeper than 250-300 nm) monocrystalline silicon wafer with a PN junction and an aluminum electrode on its back side made from conventional screen print aluminum paste was weighed on a Sartorius analytical balance from Metler Toledo. It was immersed in a 10 g/L solution of potassium carbonate. The potassium carbonate solution had a pH of 11 and the temperature was 70° C.

The wafer was immersed in the solution for 10 minutes with agitation. During immersion hydrogen gas bubbles were observed forming at the aluminum electrode indicating that the potassium carbonate was corroding the electrode. The wafer was removed from the solution, rinsed with water, air dried and weighed. The weight of the wafer decreased by 0.2 wt %. The weight loss further indicated that the aluminum electrode was corroded by the potassium carbonate solution.

EXAMPLE 4

A deep emitter monocrystalline silicon wafer with a PN junction and an aluminum electrode on its back side made from conventional screen print aluminum paste was immersed for 10 minutes in an aqueous solution of 10 g/L potassium carbonate and 1 g/L potassium silicate at pH 11 and at a temperature of 70° C. with agitation. There was no observable bubble formation from the aluminum electrode. The addition of the potassium silicate inhibited potassium carbonate corrosion of the aluminum electrode. When the solution cooled to room temperature, the solution remained flowable and clear. There was no observable gelling of the solution.

EXAMPLE 5

A deep emitter monocrystalline silicon wafer with a PN junction was selectively coated with the hot melt resist as described in Example 1 above using the DirectMask™ DoD 300 inkjet printer. The silicon wafer also contained an aluminum electrode on its back side. The aluminum electrode was made from fired conventional aluminum paste. The wafer was then immersed in a 5 g/L solution of potassium hydroxide. The potassium hydroxide solution had a pH of 13 and the temperature was 40° C. After 3 minutes in the potassium hydroxide, bubbles were observed generating from the aluminum electrode. This was indicative of corrosion action on the aluminum electrode by the potassium hydroxide.

What is claimed is:

1. A method comprises:
   a) providing a semiconductor substrate comprising a PN junction, a selective emitter on a front side and an electrode comprising aluminum on a back side of the semiconductor substrate with the PN junction, wherein the selective emitter comprises zones of low sheet resistivity;
   b) selectively applying a hot melt etch resist consisting of one or more hydrogenated rosin resins, one or more fatty acids or salts thereof and one or more optical brighteners to the zones of low sheet resistivity of the selective emitter on the semiconductor substrate with the PN junction;
   c) applying an etchant to exposed portions of the selective emitter with the PN junction to etch the exposed portions; and
   d) applying a stripper consisting of 5 g/L to 50 g/L potassium carbonate and 0.1 g/L to 10 g/L potassium silicate, water and optionally one or more antifoaming agents to the semiconductor substrate with the PN junction to remove the hot melt etch resist from the selective emitter.

2. The method of claim 1, wherein a pH of the stripper composition ranges from 8 to 12.

3. The method of claim 1, wherein a temperature of stripping ranges from room temperature to 70° C.

4. The method of claim 1, wherein the one or more antifoaming agents are chosen from vegetable oils, long chain fatty alcohols, silicone based antifoams, silicone glycols, fluorosilicones and ethylene oxide/propylene oxide copolymers.

5. The method of claim 1, further comprising depositing an anti-reflective layer on the selective emitter layer after removing the hot melt etch resist.

6. The method of claim 5, wherein the anti-reflective layer is chosen from silicon oxide, silicon nitride and a combination of silicon oxide and silicon nitride.

7. The method of claim 1, further comprising forming current tracks on the zones of low sheet resistance.

8. The method of claim 1, wherein the zones of low sheet resistivity are less than 60 ohms per square.

9. The method of claim 1, wherein the one or more hydrogenated rosin resins are in amounts of 20 wt % to 30 wt %.

10. The method of claim 1, wherein the one or more hydrogenated rosin resin is a partially hydrogenated rosin resin.

11. The method of claim 1, wherein the one or more fatty acids are in amounts of 70 wt % to 80 wt %.

12. The method of claim 1, wherein the one or more fatty acids are chosen from stearic acid, palmitic acid, myristic acid and salts thereof.

* * * * *